United States Patent [19]

Oouchi

[11] Patent Number: 5,376,854
[45] Date of Patent: Dec. 27, 1994

[54] DEVICE FOR DETECTING FAILURE IN PIEZOELECTRIC APPARATUS

[75] Inventor: Yoshito Oouchi, Kumamoto, Japan

[73] Assignee: Fujitsu Limited, Kawasaki, Japan

[21] Appl. No.: 851,552

[22] Filed: Mar. 13, 1992

[30] Foreign Application Priority Data

Mar. 18, 1991 [JP] Japan .................. 3-051838

[51] Int. Cl.$^5$ .............. H01L 41/08; G08B 21/00
[52] U.S. Cl. ................................. 310/316; 340/635
[58] Field of Search ............... 310/316, 317, 319; 363/21, 56, 54; 340/635; 318/116; 361/18, 88

[56] References Cited

U.S. PATENT DOCUMENTS

| | | | |
|---|---|---|---|
| 4,189,764 | 2/1980 | Snyder | 363/21 |
| 4,210,947 | 7/1980 | Koizumi | 363/21 |
| 4,330,816 | 5/1982 | Imazeki et al. | 363/56 |
| 4,415,960 | 11/1983 | Clark, Jr. | 363/21 |
| 4,447,841 | 5/1984 | Kent | 363/56 |
| 4,562,548 | 12/1985 | Anderson et al. | 361/18 |
| 4,584,623 | 4/1986 | Bello et al. | 361/90 |
| 4,685,020 | 8/1987 | Driscoll et al. | 361/18 |
| 4,743,789 | 5/1988 | Puskas | 310/316 |
| 4,749,897 | 6/1988 | Natsume et al. | 310/317 |
| 4,853,579 | 8/1989 | Kawasaki et al. | 310/323 |
| 4,866,588 | 9/1989 | Rene | 363/21 |
| 4,868,445 | 9/1989 | Wand | 310/316 |
| 4,879,528 | 11/1989 | Gotanda | 310/316 |
| 4,907,116 | 3/1990 | Aschwanden et al. | 361/18 |
| 5,029,269 | 7/1991 | Elliott et al. | 363/21 |
| 5,068,575 | 11/1991 | Dunsmore et al. | 363/21 |
| 5,097,171 | 3/1992 | Matsunaga et al. | 310/316 |
| 5,101,335 | 3/1992 | Ludden et al. | 363/21 |
| 5,109,326 | 4/1992 | Martin, Jr. | 363/21 |
| 5,138,217 | 8/1992 | Wada et al. | 310/316 |

FOREIGN PATENT DOCUMENTS 2-15033 4/1990 Japan.

OTHER PUBLICATIONS

English Abstract Of Japanese Examined Patent Publication (Kokoku) No. 2-15033, Nov. 14, 1983.

Primary Examiner—Steven L. Stephan
Assistant Examiner—C. LaBalle
Attorney, Agent, or Firm—Staas & Halsey

[57] ABSTRACT

A drive circuit for driving a piezoelectric element includes a transformer having a primary winding connected to a power source and a secondary winding connected to the piezoelectric element, a primary semiconductor element circuit connected to the primary winding for switching the current through the primary winding, and a secondary semiconductor element circuit connected to the secondary winding for switching the current through the secondary winding. A failure detection unit responsive to the potential at a predetermined point of the drive circuit is provided for detecting a failure in the piezoelectric apparatus and outputting a failure detection signal.

20 Claims, 13 Drawing Sheets

DEVICE FOR DETECTING FAILURE IN PIEZOELECTRIC APPARATUS

BACKGROUND OF THE INVENTION

1. Field of the Invention

The present invention relates to a device for detecting a failure in a piezoelectric apparatus. The device according to the present invention is applicable to a piezoelectric apparatus used as a driver of a wire dot printer in the field of computers.

2. Description of the Related Arts

For driving a piezoelectric element of a piezoelectric apparatus, a voltage pulse produced by the secondary circuit of a transformer is applied to the piezoelectic element. The current of the primary circuit of the transformer is intermittently interrupted in accordance with drive signals to produce the voltage pulse in the secondary circuit of the transformer.

To drive the piezoelectric element through the circuit of the transformer, a primary semiconductor element circuit is connected to the primary winding of the transformer and a secondary semiconductor element circuit is connected to the secondary winding of the transformer. A power source is connected to the primary winding of the transformer.

A drive signal $S_1$ is applied to the control terminal of a semiconductor element in the primary semiconductor element circuit. An intermittent current flows through the primary winding of the transformer in correspondence with the drive signal $S_1$, thus causing a voltage pulse to be induced in the secondary winding of the transformer, and the induced voltage pulse is applied to the piezoelectric element through a Zener diode in the secondary semiconductor element circuit to charge the piezoelectric element.

A discharge control signal $S_2$ generated in synchronization with the drive signal $S_1$ is supplied to the control terminal of a semiconductor element in the secondary semiconductor element circuit, to cause the energy induced in the secondary winding of the transformer to be released to the ground side to thus discharge the piezoelectric element.

As the result of the above-described charging and discharging, a mechanical distortion or mechanical vibration is produced, and the produced mechanical distortion or mechanical vibration is applied to a load device.

The equivalent circuit of a piezoelectric element is represented by an electrostatic capacitance, and a problem arises in that this electrostatic capacitance, in manufacturing the piezoelectric element, cannot be constantly maintained, and that a failure when open, i.e. interruption of electrical conduction, or a short-circuit is apt to occur, particularly in the case of a small sized piezoelectric element.

In a piezoelectric apparatus with a drive circuit, it is possible for a failure to occur in an open state in the semiconductor element in the secondary semiconductor element circuit, in the piezoelectric element, or the like. When such a failure occurs, the secondary circuit of the transformer of the piezoelectric apparatus opens, and thus the energy stored in the primary circuit of the transformer cannot find a location in the secondary circuit of the transformer and cannot be transmitted, and accordingly, the stored energy is consulted in the semiconductor element in the primary semiconductor element circuit.

Under such circumstances, if the drive circuit of the piezoelectric apparatus is kept in the operating state for a long period when the secondary circuit of the transformer is open, an abnormal heating of the semiconductor element in the primary semiconductor element circuit will occur, which can cause a permanent breakdown of the semiconductor element in the primary semiconductor element circuit.

In a piezoelectric apparatus with a drive circuit, a short circuit in the piezoelectric element can also occur. At this time, the secondary circuit of the transformer is short-circuited directly to the ground only through the internal resistance of the secondary winding of the transformer, other small resistances, and the like.

Under such circumstances, if a driving state continues such that a current exceeding a nominal current flows through the semiconductor element in the secondary semiconductor element circuit, a breakdown of the semiconductor element in the secondary semiconductor element circuit will occur, and an abnormal heating of the primary circuit of the transformer due to the excessive current will also occur.

The delay of the detection of the above-described failure in the piezoelectric apparatus would not only prevent the function of a load device to which the mechanical distortion or mechanical vibration is applied, but would also cause an undesirable influence on the peripheral devices, such as abnormal heating. Therefore, a delay in the detection of a failure is undesirable.

SUMMARY OF THE INVENTION

An object of the present invention is to provide an improved device for detecting a failure in a piezoelectric apparatus, in which the failure in the piezoelectric apparatus when either in an open state or in a short-circuit state is quickly detected and an alarm sounded.

Based on this fast detection, it is possible to stop the operation of the load device, and replace at an earlier stage a failed piezoelectric element with a new element, to ensure the maintenance of the piezoelectric elements, or to selectively stop the operation of the drive circuit connected to a failed piezoelectric element to ensure the protection of the piezoelectric apparatus.

According to the present invention there is provided a device for detecting a failure in a piezoelectric apparatus including:

a piezoelectric element;
  a drive circuit for driving the piezoelectric clement including a switching element for switching a current to be supplied to the piezoelectric element, and
  a failure detection unit responsive to the potential of a predetermined point of the drive circuit for detecting a failure in the piezoelectric apparatus and delivering a failure detection signal.

According to the present invention there is also provided a device for detecting a failure in a piezoelectric apparatus including:

a piezoelectric element;
  a drive circuit for driving the piezoelectric element, including a transformer having a primary winding connected to a power source and a secondary winding connected to the piezoelectric element, a primary semiconductor element circuit connected to the primary winding for switching the current through the primary winding, and a secondary semiconductor element circuit connected to the secondary winding for switching the current through the secondary winding, and a failure detection unit responsive to the potential at a predetermined point of the drive circuit for detecting a failure in the piezoelectric apparatus and delivering a failure detection signal.

According to the present invention there is also provided a device for detecting a failure in a plurality of piezoelectric apparatus including:

a plurality of piezoelectric elements;

a plurality of drive circuits for driving the piezoelectric elements, each including a transformer having a primary winding connected to a power source and a secondary winding connected to the piezoelectric element, a primary semiconductor element circuit for switching the current through the primary winding, and a secondary semiconductor element circuit connected to the secondary winding for switching the current through the secondary winding; and a failure detection unit provided in common for the plurality of drive circuits for detecting in response to the potential at a predetermined, point of each of the drive circuits, a failure in the plurality of piezoelectric apparatuses, and delivering a failure detection signal.

DESCRIPTION OF THE PREFERRED EMBODIMENTS

Figure 1:
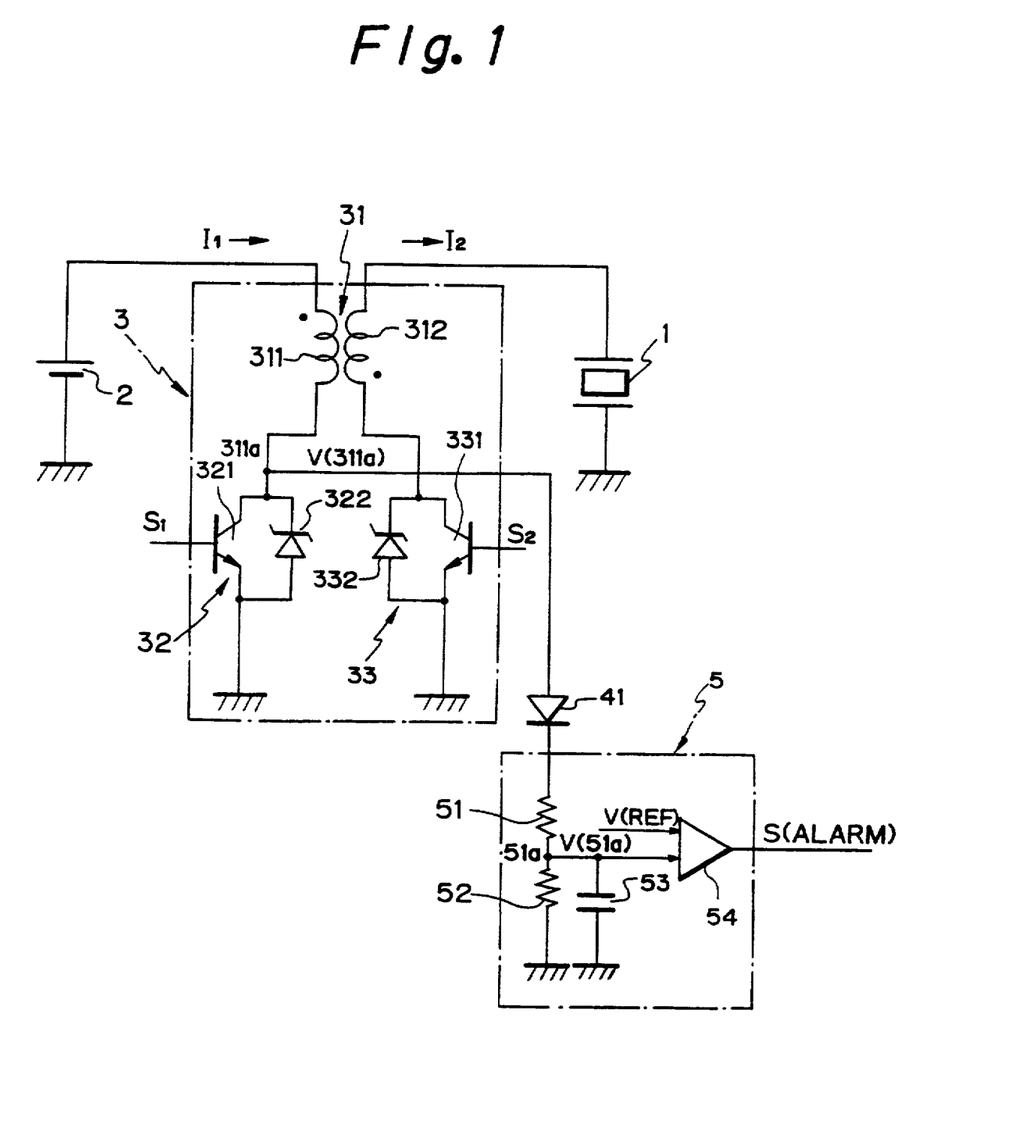
FIG. 1 shows a device for detecting a failure in a piezoelectric apparatus according to an embodiment of the present invention.

A device for detecting a failure in a piezoelectric apparatus according to an embodiment of the present invention is shown in FIG. 1. The device of FIG. 1 comprises a piezoelectric element 1, a power source 2, a drive pulse generating circuit 3, a diode 41, and a failure detecting circuit 5. The drive pulse generating circuit 3 comprises a transformer 31 having a primary winding 311 and a secondary winding 312, a primary semiconductor element circuit 32 having a transistor 321 and a Zener diode 322, and a secondary semiconductor element circuit 33 having a transistor 331 and a Zener diode 332. The failure detecting circuit 5 comprises by resistors 51 and 52, a capacitor 53, and a comparator 54. The failure detection circuit 5 is connected to the junction 311a of the primary winding 311 and the primary semiconductor element circuit 32. A field effect transistor is preferably used for each of the transistors 321 and 331. In the failure detection circuit 5, a filter is formed by the resistors 51 and 52 and the capacitor 53. A predetermined reference voltage V(REF) is supplied to one input terminal of the comparator 54.

In the device of FIG. 1, when an open failure occurs either in the piezoelectric element 1 or in any of the circuit elements in the secondary circuit of the transformer 31, the failure is detected by the failure detecting circuit 5 and the alarm signal is delivered therefrom. The alarm signal may be supplied to an alarm device such as a lamp, a liquid crystal device, and the like.

Figure 2:
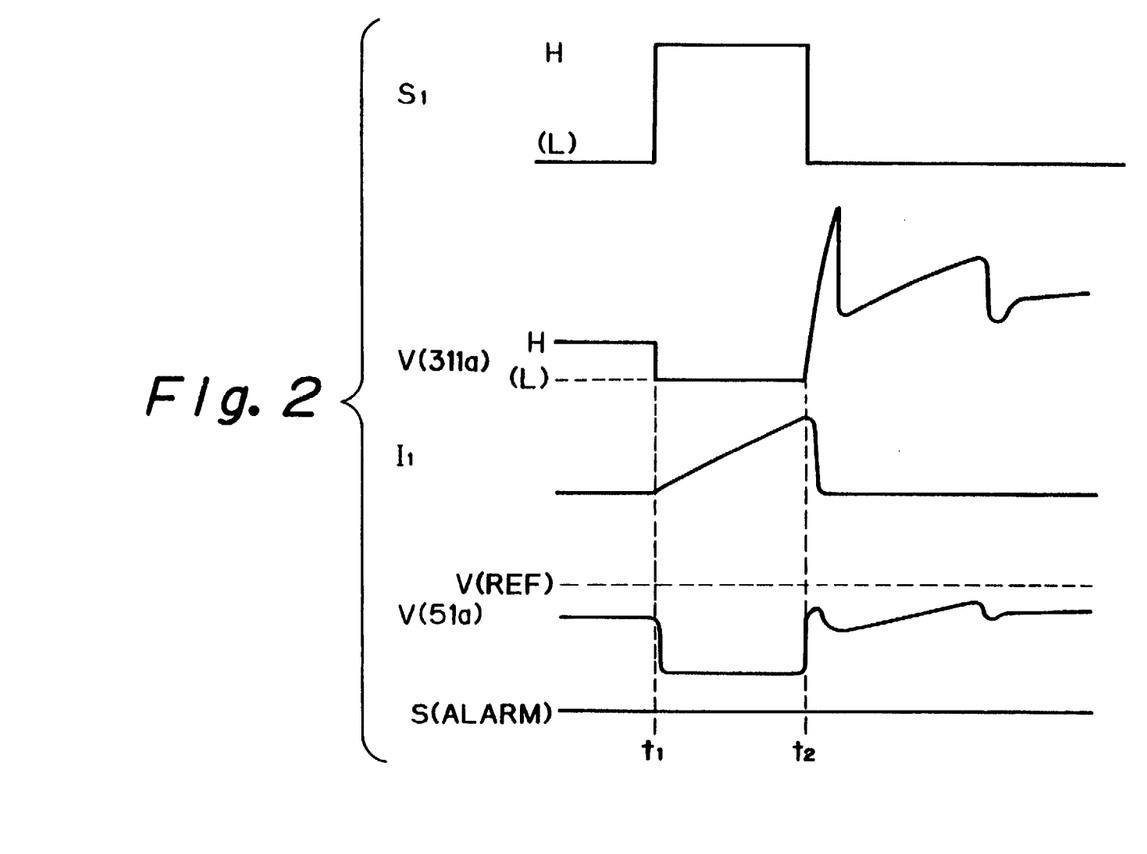
FIG. 2 shows an example of the waveforms of voltage and current in the circuit of a piezoelectric apparatus in a normal state.
Figure 3:
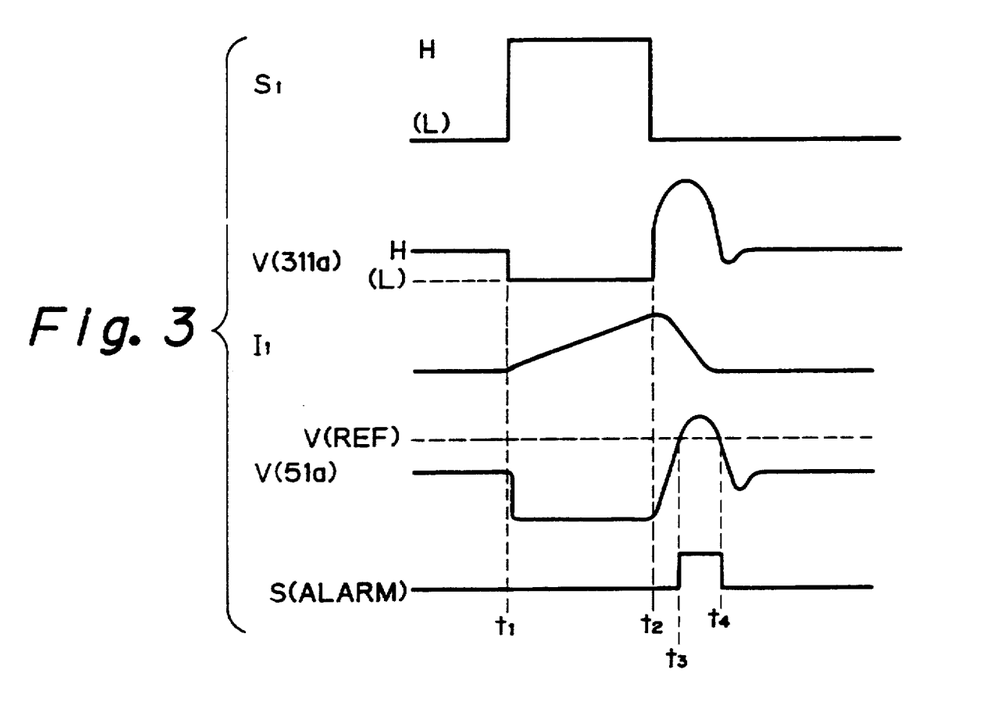
FIG. 3 shows an example of the waveforms of voltage and current in the circuit of a piezoelectric apparatus in a failed state.

Examples of the waveforms of voltage and current in the device of FIG. 1 in the normal state are shown in FIG. 2, and in the failed state in FIG. 3. As shown in FIG. 2, when a drive pulse $S_1$ is supplied to the gate of the transistor 321 at time $t_1$, the voltage $V(311a)$ at the node 311a is at a LOW level while the transistor 321 is in an ON state until time $t_2$. When the drive pulse $S_2$ is terminated at time $t_2$, a sharp rise occurs in the voltage $V(311a)$ by a transient phenomena due to the effect of the energy stored in the transformer inductance 31 and the piezoelectric element 1. The primary current $I_1$ increases linearly from time $t_1$ and drops at time $t_2$.

The voltage $V(311a)$ is supplied via the diode 41 to the failure detection circuit 5, where the voltage is divided by the resistor 51 and 52 and the divided voltage $V(51a)$ is supplied to one input terminal of the comparator 54, the sharp rise in voltage $V(311a)$ is reduced $V(51a)$ by the filtering of the filter circuit consisting of resistors 51 and 52 and capacitance 53. The level of the reference voltage V(REF) is assumed to be as shown in FIG. 2, and accordingly, in the normal state of FIG. 2, no alarm is output from the comparator 54.

As shown in FIG. 3, in the failed state, the period of voltage variation due to the transient phenomena after time $t_2$ is significantly extended. The voltage $V(51a)$ supplied to one input of the comparator 54 exceeds the reference voltage V(REF) from $t_3$ to $t_4$, and thus an alarm signal S(ALARM) is output by the comparator 54.

Figure 4:
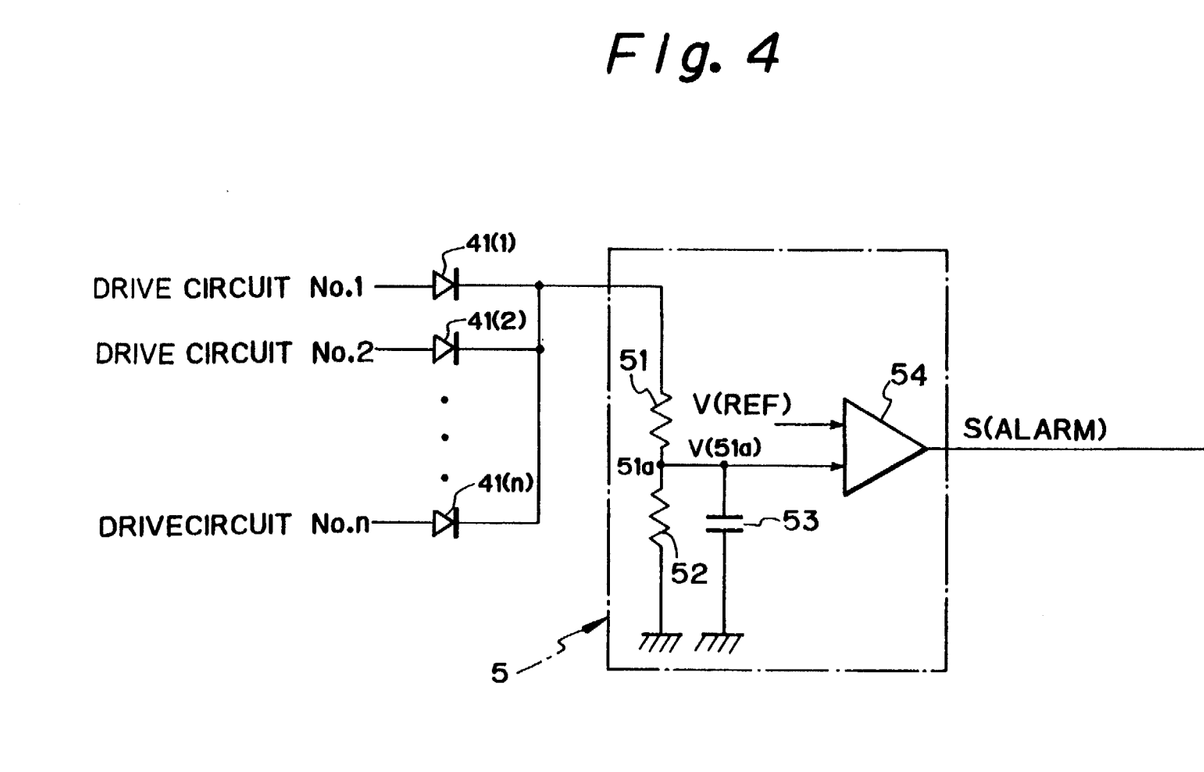
FIG. 4 illustrates a part of a device for detecting a failure in piezoelectric apparatuses according to another embodiment of the present invention.

A part of a device for detecting a failure in piezoelectric apparatuses according to another embodiment of the present invention is shown in FIG. 4. In this embodiment, a plurality of piezoelectric elements and a plurality of drive circuits for the piezoelectric elements are provided, and a common failure detecting circuit 5 is connected through diodes 41(1), 41(2), . . . 41(n) to drive circuit No. 1, circuit No. 2 . . . circuit No. n, respectively. In the case of the piezoelectric apparatuses for driving wire dot pins, the number n is, for example, 24.

Figure 5:
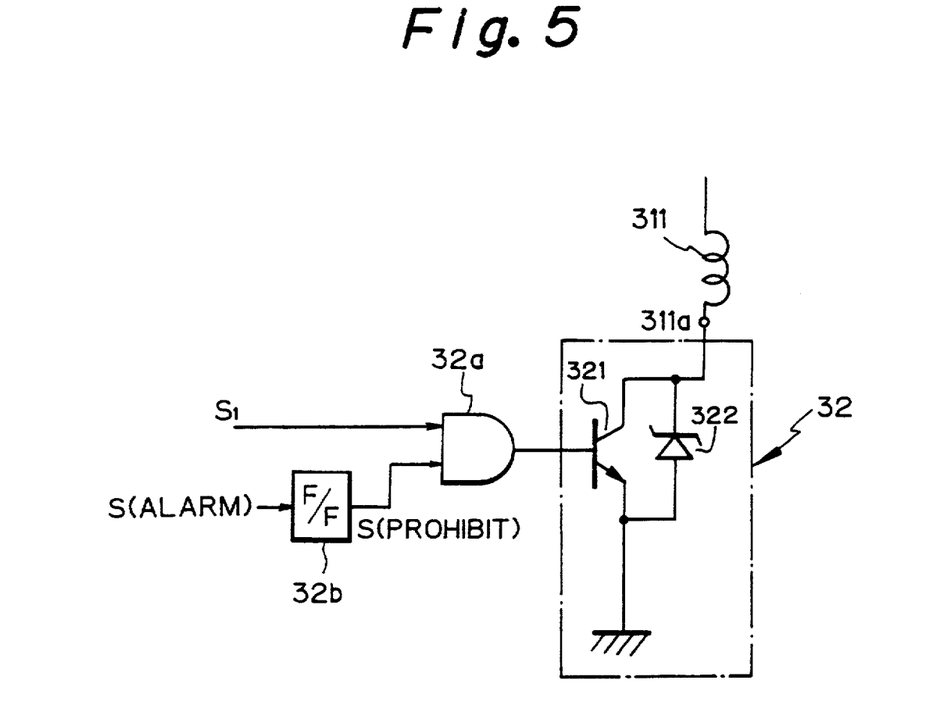
FIG. 5 illustrates a part of a device for detecting a failure in piezoelectric apparatuses according to another embodiment of the present invention.

A part of a device for detecting a failure in piezoelectric apparatuses according to another embodiment of the present invention is shown in FIG. 5. The device of FIG. 5 is to be used in combination with the device of FIG. 4. The alarm signal S(ALARM) output by the failure detection circuit 5 is supplied to a flip-flop circuit 32b, which outputs a prohibiting signal S(PROHIBIT). The prohibition signal and the drive pulse $S_1$ are supplied to an AND gate 32a, the output of which is supplied to the gate of the transistor 321 in the primary semiconductor element circuit 32. By using the device of FIG. 5, it is possible to stop the operation of the drive circuit for the failed piezoelectric apparatus and ensure the operation of the remaining piezoelectric apparatuses.

Figure 6:
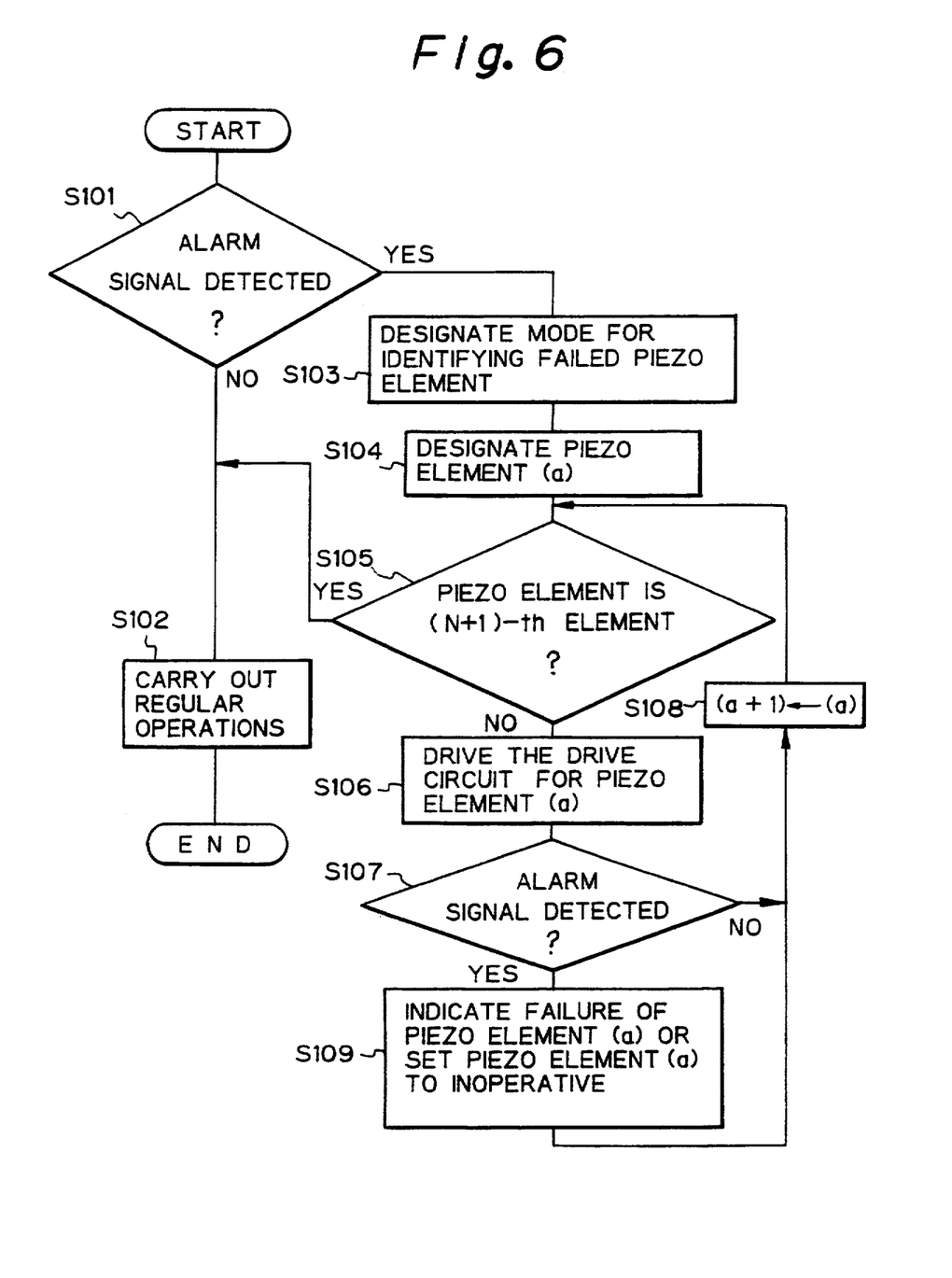
FIG. 6 shows an example of a flow chart of the operation of the device shown in FIG. 5.

An example of a flow chart of the operation of the device of FIG. 5 is shown in FIG. 6. First, it is determined whether or not an alarm signal is detected (S101). If the alarm signal indicating the failure of the piezoelectric element is not detected, the usual operation is carried out (S102). If the alarm signal is detected, the process proceeds to step S103 where the mode for identifying the failed piezoelectric element is designated (S103). Thereafter, a predetermined (a)-th piezoelectric element is designated (S104), and it is determined whether or not the piezoelectric element in question is the (N+1)-th piezoelectric element (S105).

If the determination is YES, which indicates that the failure detection for all piezoelectric elements is completed, the process proceeds to step S102 where regular operations are carried out. If the determination is NO, the drive circuit for (a)-th piezoelectric element carries out the failure detection (S106), and it is determined whether or not the alarm signal is detected (S107). If the determination is NO, the (n)-th order of the piezoelectric element is incremented by one to the (n+1)-th order of the piezoelectric element (S108), the process returns to step S105, and the following processes are repeated. If the determination in step S107 is YES, which indicates that the (a)-th piezoelectric element in question has failed, the failure of the (a)-th piezoelectric element is indicated or the (a)-th piezoelectric element in question is set to an inoperative state (S109), the process proceeds to step S108, and the following processes are repeated.

Figure 7:
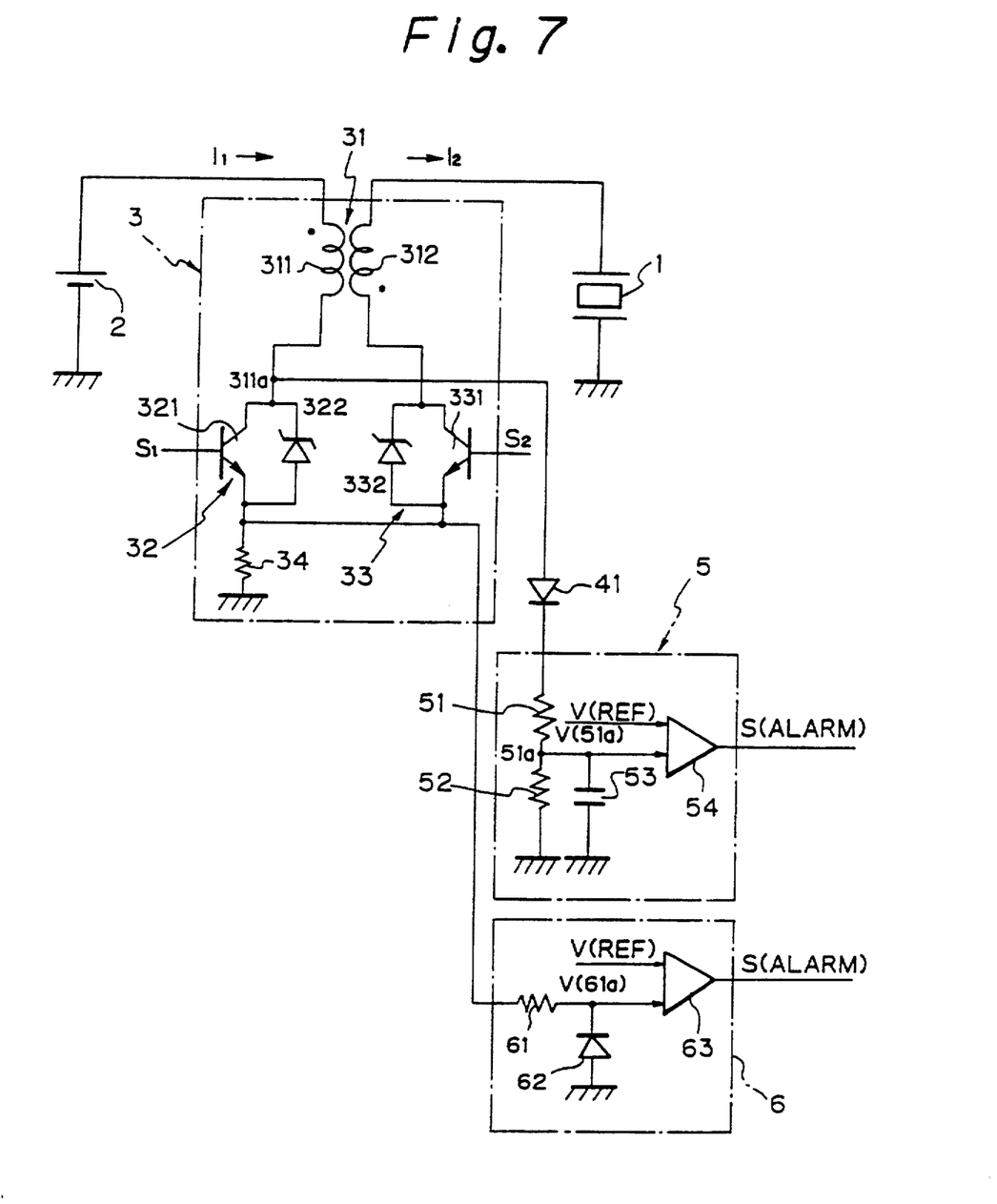
FIG. 7 shows a device for detecting a failure in a piezoelectric apparatus according to another embodiment of the present invention.

A device for detecting a failure in a piezoelectric apparatus according to another embodiment of the present invention is shown in FIG. 7. In FIG. 7, the arrangement of the piezoelectric element 1, the power source 2, the drive pulse generating circuit 3, the diode 41, and the failure detection circuit 5 is basically the same as in the device of FIG. 1. In the device of FIG. 7, a terminal of the primary semiconductor element circuit 32 and a terminal of the secondary semiconductor element circuit 33 are connected together and this connected node is connected to another failure detection circuit 6 comprising a resistor 61, a diode 62, and a comparator 63. The connected node of the terminals of the primary and secondary semiconductor element circuits is grounded through a resistor 34 and used for the detection of the failure.

The failure detection circuit 6 is useful for detecting a failure in the piezoelectric element 1 during a short-circuit.

Figure 8:
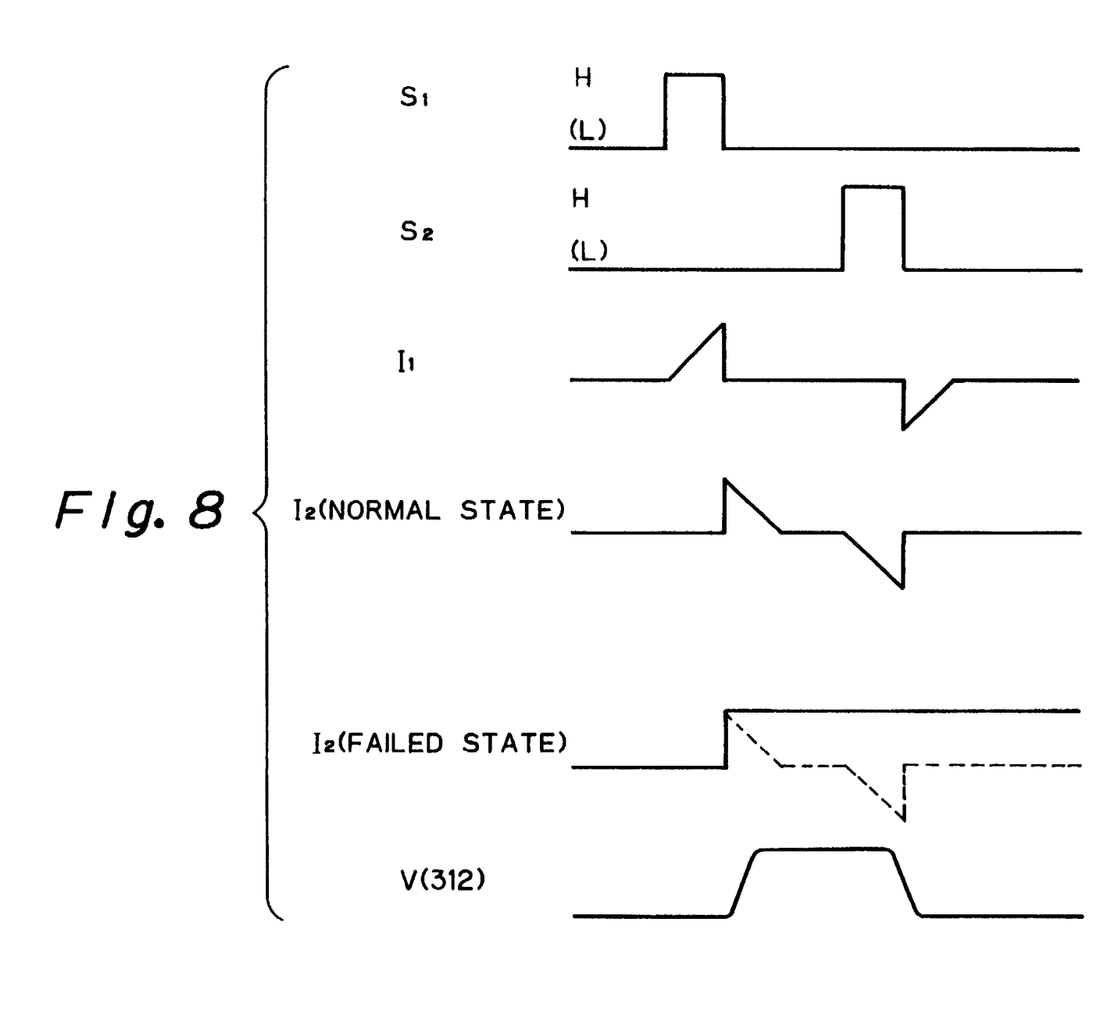
FIG. 8 shows an example of the waveforms of voltage and current in the circuit of a piezoelectric apparatus of FIG. 7 in the normal state.
Figure 9:
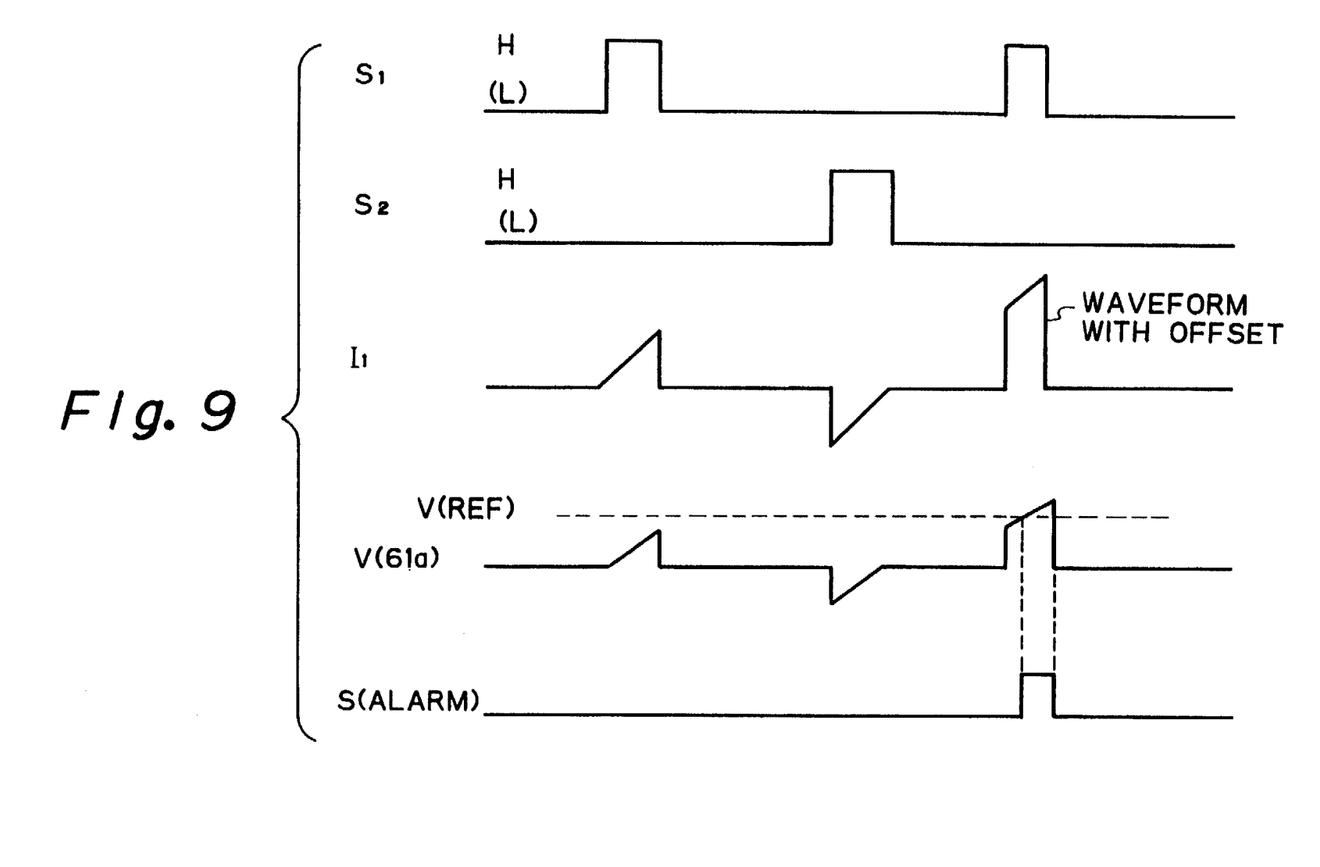
FIG. 9 shows an example of the waveforms of voltage and current in the circuit of a piezoelectric apparatus shown in FIG. 7 in the failed state.

Examples of the waveforms of voltage and current in the circuit of a piezoelectric apparatus of FIG. 7 in the nominal state is shown in FIG. 8, and in the failed state in FIG. 9. As shown in FIG. 8, the primary current $I_1$ flows in accordance with the drive pulse $S_1$ supplied to the gate of the transistor 321 in the primary semiconductor element circuit 32, and the secondary current $I_2$ flows in accordance with the discharge control pulse $S_2$ supplied to the gate of the transistor 331 in the secondary semiconductor element circuit 33. To discharge the electric charge stored in the piezoelectric element 1 and the windings of the transformer 31, the currents $I_1$ and $I_2$ flow in a negative direction. If the piezoelectric element 1 is in a normal state, the waveform of the voltage V(312) across the piezoelectric element 1 is normal.

If the piezoelectric element 1 fails during a short-circuit, however, the secondary current $I_2$ a (FAILED STATE) does not immediately return to zero but continues to flow as shown in the solid line in $I_2$ (FAILED STATE).

As shown in FIG. 9, under the condition that the secondary current $I_2$ continues to flow because of the failure of the piezoelectric element during a short-circuit, if the primary current $I_1$ flows in accordance with the subsequent drive pulse, the waveform of $I_1$ becomes a waveform with an offset. Because of this waveform $I_1$, the voltage V(34) across the resistor 34 reveals a similar waveform as a voltage corresponding to the failure. This voltage V(34) corresponding to the failure is compared with the reference voltage V(REF) in the comparator 63, which outputs the alarm signal S(ALARM).

Figure 10:
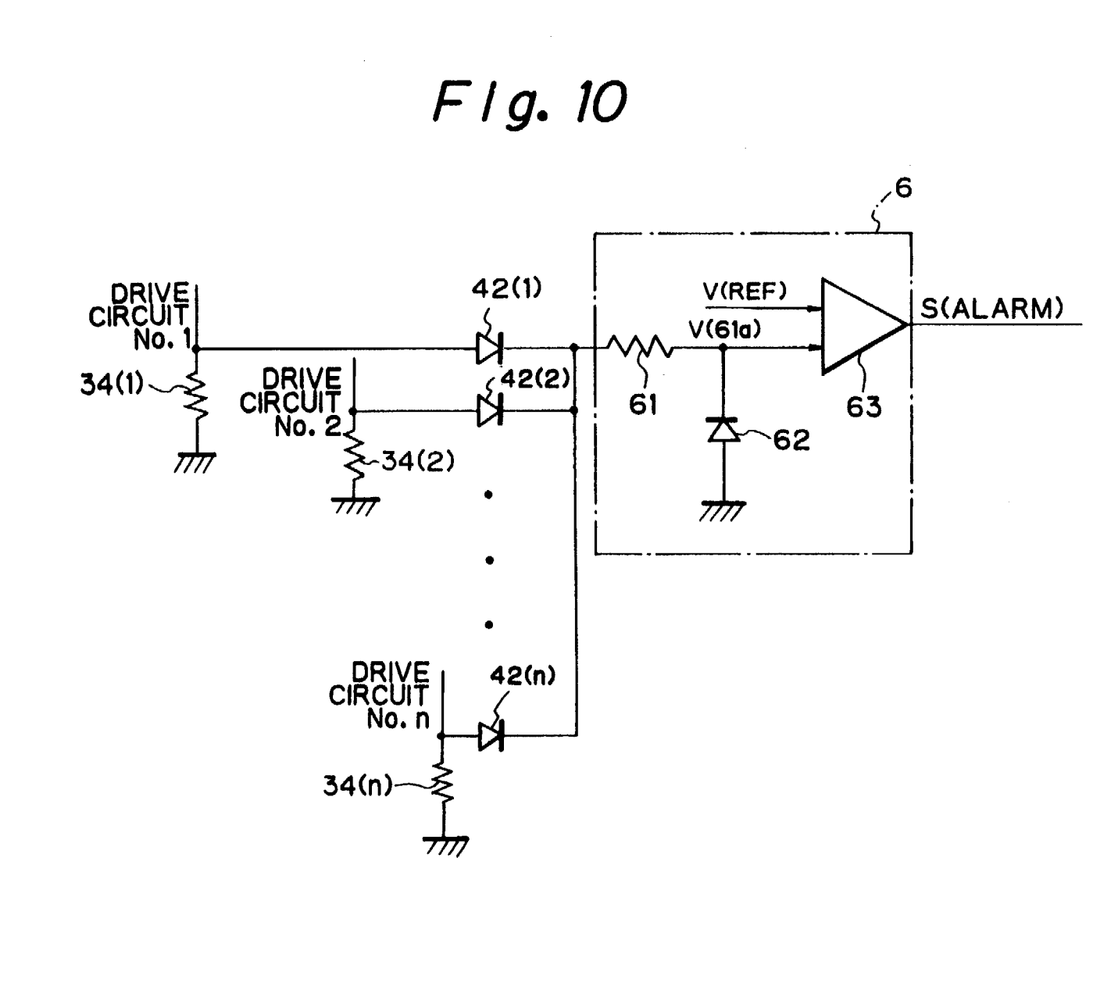
FIG. 10 shows a part of a device for detecting a failure in piezoelectric apparatuses according to another embodiment of the present invention.

A part of a device for detecting a failure in a piezoelectric apparatus according to another embodiment of the present invention is shown in FIG. 10. In this embodiment, a plurality of piezoelectric element and a plurality of drive circuits for the piezoelectric elements are provided, and a con, non failure detecting circuit 6 is connected through diodes 42(1), 42(2), . . . 42(n) to drive circuit No. 1, drive circuit No. 2, . . . drive circuit No. n, respectively.

Figure 11:
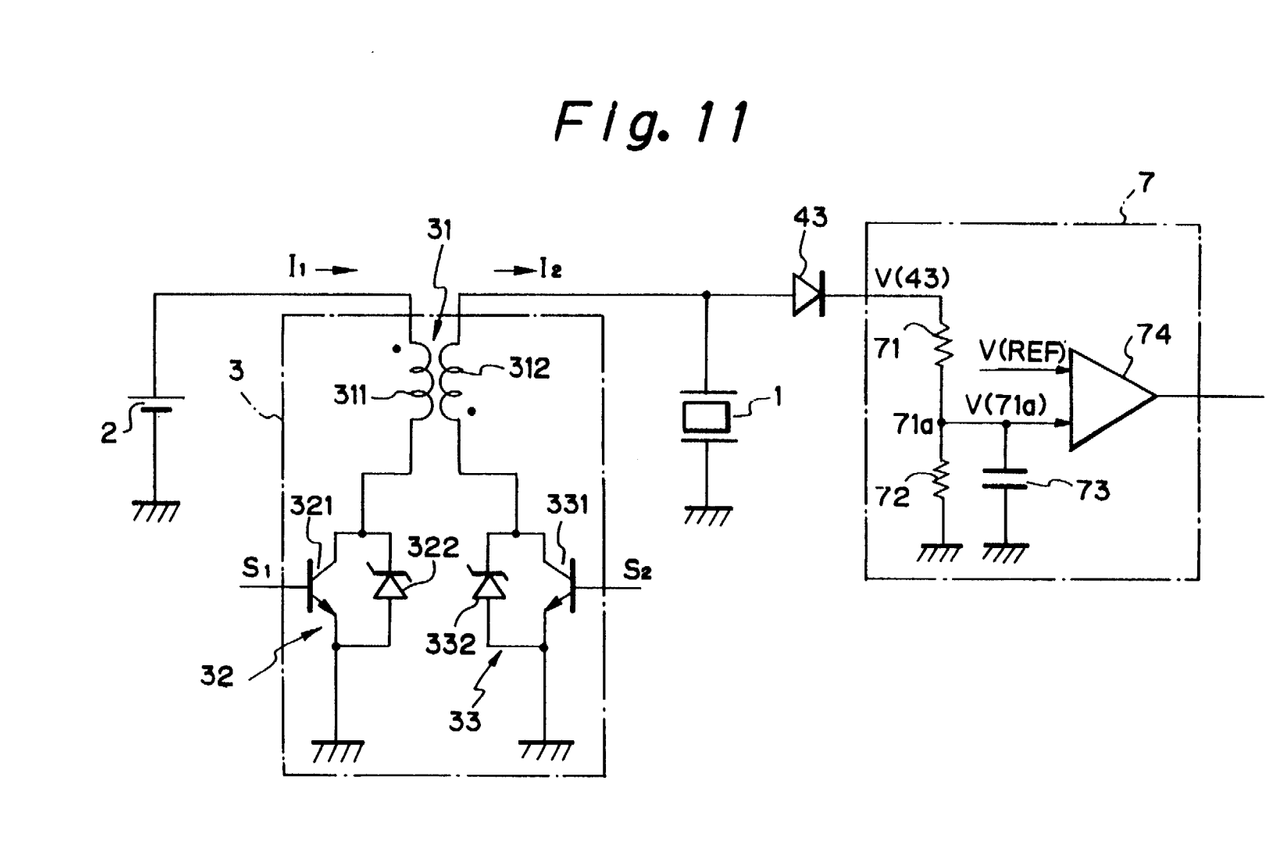
FIG. 11 shows a device for detecting a failure in a piezoelectric apparatus according to another embodiment of the presnt invention.

A device for detecting a failure in a piezoelectric apparatus according to another embodiment of the present invention is shown in FIG. 11. In FIG. 11, the arrangement of the piezoelectric element 1, the power source 2, and the drive pulse generating circuit 3 is basically the same as in the device of FIG. 1. In the device of FIG. 11, a failure detection circuit 7 comprising resistors 71 and 72, a capacitor 73, and a comparator 74 is connected via a diode 43 to the junction between the piezoelectric element 1 and the drive pulse generating circuit 3. Since the voltage across the piezoelectric element 1 increases to more than twice that of the regular voltage across the piezoelectric element 1 during a failure of the piezoelectric element when short-circuited the failure can be detected by the failure detecting circuit 7 based on this increase of the voltage across the piezoelectric element 1.

Figure 12:
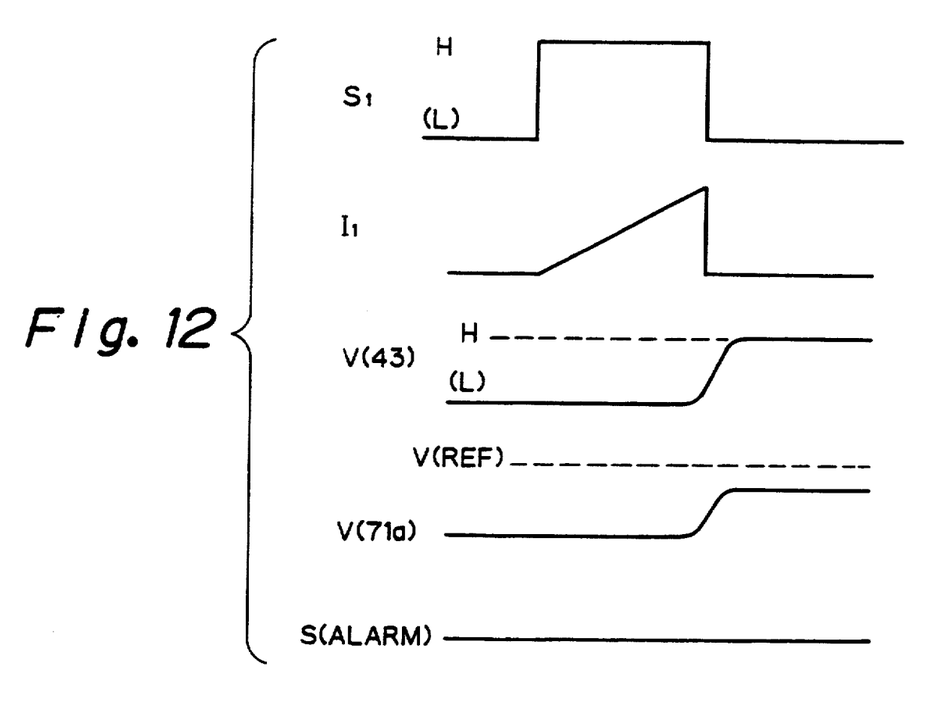
FIG. 12 shows an example of the waveforms of voltage and current in the circuit of a piezoelectric apparatus shown in FIG. 11 in the normal state.
Figure 13:
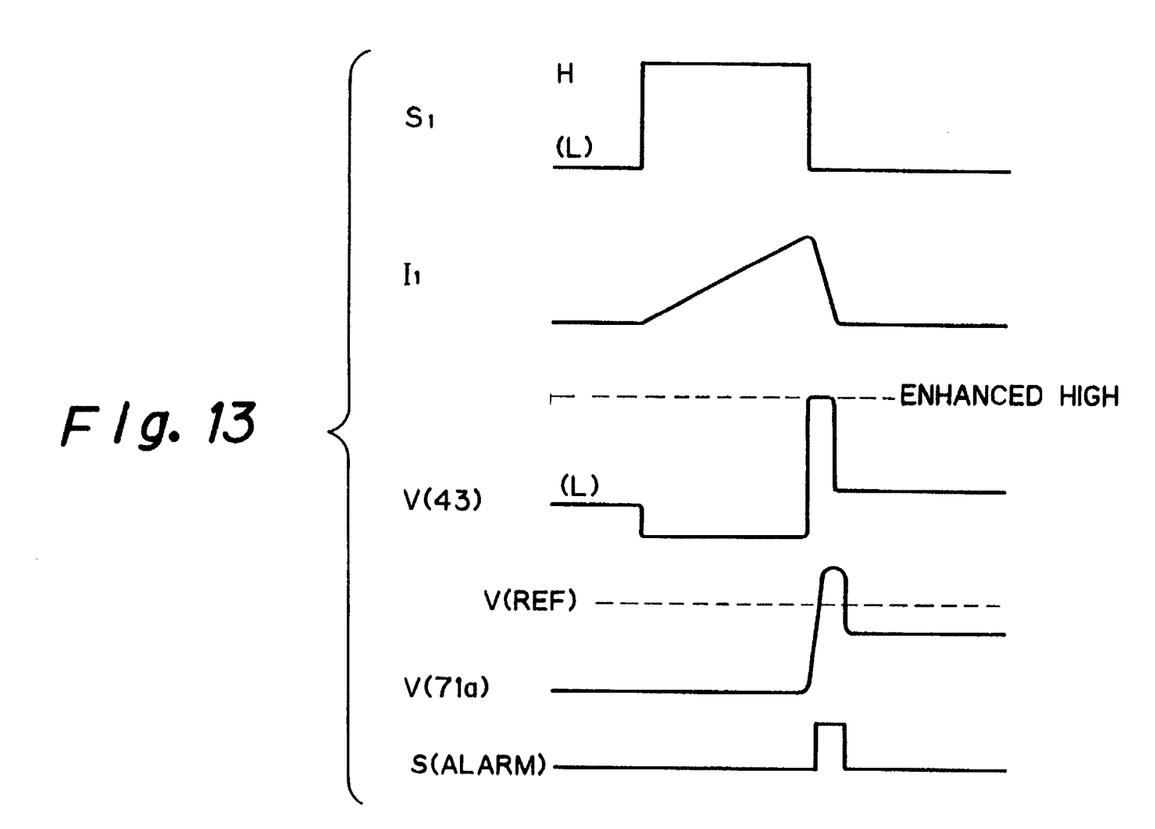
FIG. 13 shows an example of the waveforms of voltage and current in the circuit of a piezoelectric apparatus shown in FIG. 11 in the failed state.

An example of the waveforms of voltage and current in the circuit of a piezoelectric apparatus shown in FIG. 11 in the normal state is shown in FIG. 12, and in the failed state in FIG. 13. As shown in FIG. 11, in the normal state, the voltage V(71a) supplied to one input terminal of the comparator 74 does not exceed the reference voltage V(REF) supplied to the other input terminal, so that no alarm signal is output by the comparator 74.

As shown in FIG. 13, in a failed state of an open piezoelectric element 1, the voltage V(43) supplied to the failure detection circuit 7 rises to a level enhanced from the normal HIGH potential level, and thus the 1voltage V(71a) exceeds the reference voltage V(REF), and accordingly, an alarm signal S(ALARM) is output.

I claim:

1. A device for detecting failures, including an open-circuit state failure and a short-circuit state failure, in a piezoelectric apparatus, the device comprising:
   a piezoelectric element;
   a drive circuit driving said piezoelectric element including a switching element, which switches a current to be supplied to said piezoelectric element; and
   failure detection means responsive to a potential at a predetermined point of said drive circuit for detecting said failures in said piezoelectric apparatus and for outputting a failure detection signal,
   the failures of the piezoelectric apparatus including an open-circuit state failure and a short-circuit state failure being detected and an alarm being delivered to warn an occurrence of a failure based on the detection of the potential at the predetermined point of said drive circuit.

2. A device for detecting failure in the piezoelectric apparatus as claimed in claim 1, wherein the failure detection means comprises:
   a voltage divider and filter circuit connected to the predetermined point, receiving the potential from the predetermined point and outputting a second potential; and
   a comparator having a first input, a second input and an output, wherein
      the comparator receives a reference voltage through the first input, receives the second potential from the voltage divider and filter circuit through the second input and outputs the failure detection signal upon determining the failure of the piezoelectric element.

3. A device for detecting failure in the piezoelectric apparatus as claimed in claim 1, wherein the failure detection means comprises:
   a resistor;
   a diode; and
   a comparator, having a first input, a second input and an output, wherein the comparator receives a reference voltage through the first input, receives the potential from the predetermined point by way of the resistor and the diode, and outputs the failure detection signal upon determining the failure of the piezoelectric element.

4. A device for detecting a failure in a piezoelectric apparatus comprising:
   a piezoelectric element;
   a drive circuit driving said piezoelectric element including a transformer having a primary winding connected to a power source and a secondary winding connected to said piezoelectric element, a primary semiconductor element circuit connected to said primary winding and switching current through said primary winding, and a secondary semiconductor element circuit connected to said secondary winding and switching the current through said secondary winding; and
   failure detection means responsive to a potential at a predetermined point of said drive circuit for detecting said failure in said piezoelectric apparatus and for outputting a failure detection signal.

5. A device according to claim 4, wherein said failure detection means is a circuit detecting said failure in one of said secondary semiconductor element circuit and said piezoelectric element.

6. A device according to claim 5, wherein said failure in one of said secondary semiconductor element circuit and said piezoelectric element is an open failure.

7. A device according to claim 5, wherein said failure in said piezoelectric element is a short-circuit.

8. A device according to claim 4, further comprising an alarm and interruption circuit responsive to a detection of a failure in the piezoelectric element, generating an alarm and simultaneously interrupting operation of the piezoelectric apparatus.

9. A device according to claim 4, wherein said failure detection circuit is connected via a diode to a junction between said primary winding of said transformer and said primary semiconductor element circuit.

10. A device according to claim 4, wherein one side terminal of said primary semiconductor element circuit and one side terminal of said secondary semiconductor element circuit are connected together and the connected point is grounded via a resistor, and said failure detection means is connected to said connected point.

11. A device according to claim 4, wherein said failure detection circuit is connected via a diode to a junction between said piezoelectric element and said secondary winding of said transformer.

12. A device for detecting a failure in a plurality of piezoelectric apparatuses comprising:
   a plurality of piezoelectric elements;
   a plurality of drive circuits driving said plurality of piezoelectric elements, each drive circuit including a transformer having a primary winding connected to a power source and a secondary winding connected to a piezoelectric element, a primary semiconductor element circuit switching a current through the primary winding, and a secondary semiconductor element circuit connected to the secondary winding and switching current through the secondary winding; and
   failure detection means provided in common for said plurality of drive circuits for detecting, in response to a potential at a predetermined point of each of said drive circuits, said failure in said plurality of piezoelectric apparatuses and for outputting a failure detection signal.

13. A device according to claim 12, further comprising an alarm and interruption circuit responsive to a detection of the failure of any of the piezoelectric elements, generating an alarm and simultaneously interrupting operation of any piezoelectric apparatuses having the failed piezoelectric element.

14. A device according to claim 12, further comprising a selective drive circuit responsive to the detection of the failure in the piezoelectric elements, which identifies the failed piezoelectric element, eliminates, a drive signal supplied to the failed piezoelectric element, and maintains a normal operation of the piezoelectric elements which have not failed.

15. A device for detecting failure in the plurality of piezoelectric apparatuses as claimed in claim 12, wherein the failure detection means comprises:
   a voltage divider and filter circuit connected to the predetermined point in each of the drive circuits; and
   a comparator, having a first input, a second input and an output wherein the comparator receives a reference voltage through the first input, receives the potential from the predetermined point of each of the drive circuits by way of the voltage divider and filter circuit, and outputs the failure detection signal upon determining the failure of the piezoelectric element.

16. A device for detecting failure in the plurality of piezoelectric apparatuses as claimed in claim 12, wherein the failure detection means comprises:
   a resistor;
   a diode; and
   a comparator, having a first input, a second input and an output, wherein the comparator receives a reference voltage through the first input, receives the potential from a predetermined point ill each of the drive circuits by way of the resistor and the diode, and outputs the failure detection signal upon determining the failure of the piezoelectric element.

17. A device for detecting a failure in a piezoelectric apparatus comprising:
   a piezoelectric element;
   a drive circuit driving said piezoelectric element including a switching element, which switches current to be supplied to said piezoelectric element; and
   failure detection means, responsive to a first potential at a first predetermined point of said drive circuit and a second potential at a second predetermined point of said drive circuit, for detecting said failure in said piezoelectric apparatus and for outputting a failure detection signal.

18. A device for detecting failure in the piezoelectric apparatus as claimed in claim 12, wherein the failure detection means comprises:
   a voltage divider and filter circuit connected to the first predetermined point and receiving the potential from the predetermined point; and
   a first comparator having a first input, a second input and an output, wherein
      the first comparator receives a reference voltage through the first input, receives the first potential from the voltage divider and filter circuit through the second input and outputs the failure detection signal upon determining the failure of the piezoelectric element;
   a resistor;
   a diode; and
   a second comparator, having a first input, a second input and an output, wherein the second comparator receives the reference voltage through the first input, receives the second potential from the second predetermined point by way of the resistor and the diode through the second input, and outputs the failure detection signal upon determining the failure of the piezoelectric element.

19. A device for detecting a failure in a plurality of piezoelectric apparatuses comprising:
   a plurality of piezoelectric elements;
   a plurality of drive circuits driving said plurality of piezoelectric elements, each drive circuit including a transformer having a primary winding connected to a power source and a secondary winding connected to a piezoelectric element, a primary semiconductor element circuit switching current through the primary winding, and a secondary semiconductor element circuit connected to the secondary winding and switching current through the secondary winding; and
   failure detection means provided in common for said plurality of drive circuits for detecting, in response to a first potential at a first predetermined point and a second potential at a second predetermined point of each of said drive circuits, said failure in said plurality of piezoelectric apparatuses and for outputting a failure detection signal.

20. A device for detecting failure in the plurality of piezoelectric apparatuses as claimed in claim 19, wherein the failure detection means comprises:
   a voltage divider and filter circuit connected to the first predetermined point in each of the drive circuits and receiving the first potential from the predetermined point in each of the drive circuits;
   a first comparator having a first input, a second input and an output, wherein
      the comparator receives a reference voltage through the first input, receives the first potential by way of the voltage divider and filter circuit through the second input and outputs the failure detection signal upon determining the failure of at least one piezoelectric element;
   a resistor;
   a diode; and
   a second comparator, having a first input, a second input and an output, wherein the second comparator receives the reference voltage through the first input, receives the second potential from the second predetermined point in each of the drive circuits by way of the resistor and the diode, and outputs the failure detection signal upon detecting the failure in at least one of the piezoelectric elements.

* * * * *

UNITED STATES PATENT AND TRADEMARK OFFICE
CERTIFICATE OF CORRECTION

PATENT NO. : 5,376,854
DATED : December 27, 1994
INVENTOR(S) : Yoshito OOUCHI

It is certified that error appears in the above-indentified patent and that said Letters Patent is hereby corrected as shown below:

Col. 1, line 68, delete "consulted" and insert therefor --consumed--.

Col. 6, line 37, delete "con, non" and insert therefor --common--.

Col. 8, line 57, delete ",".

Col. 9, line 16, delete "ill" and insert --in--.

Signed and Sealed this

Fourteenth Day of March, 1995

Attest:

BRUCE LEHMAN

Attesting Officer        Commissioner of Patents and Trademarks